United States Patent
Chang et al.

(10) Patent No.: US 8,097,803 B2
(45) Date of Patent: Jan. 17, 2012

(54) SOLAR ENERGY SYSTEM

(75) Inventors: Yi-Chieh Chang, Taichung (TW);
Yarn-Chen Chen, Hsinchu (TW)

(73) Assignee: Sunplus mMedia Inc., Hsinchu (TW)

( * ) Notice: Subject to any disclaimer, the term of this patent is extended or adjusted under 35 U.S.C. 154(b) by 477 days.

(21) Appl. No.: 12/251,417

(22) Filed: Oct. 14, 2008

(65) Prior Publication Data

US 2010/0037934 A1    Feb. 18, 2010

(30) Foreign Application Priority Data

Aug. 13, 2008 (TW) ................................ 97130878 A

(51) Int. Cl.
*H01L 31/042* (2006.01)
*F24J 2/00* (2006.01)

(52) U.S. Cl. ......... 136/246; 136/259; 136/248; 126/569

(58) Field of Classification Search ................ 136/246, 136/248, 259; 126/569
See application file for complete search history.

(56) References Cited

U.S. PATENT DOCUMENTS

| | | | |
|---|---|---|---|
| 4,186,033 A | 1/1980 | Boling et al. | |
| 4,312,330 A | 1/1982 | Holdridge | |
| 4,395,582 A | 7/1983 | Damsker | |
| 4,444,992 A | 4/1984 | Cox, III | |
| 5,376,185 A | 12/1994 | Wanlass | |
| 5,405,453 A | 4/1995 | Ho et al. | |
| 5,409,550 A * | 4/1995 | Safir | 136/246 |
| 5,902,417 A | 5/1999 | Lillington et al. | |
| 5,958,572 A * | 9/1999 | Schmidt et al. | 428/320.2 |
| 6,368,892 B1 | 4/2002 | Arya | |
| 6,372,980 B1 | 4/2002 | Freundlich | |
| 6,603,069 B1 | 8/2003 | Muhs et al. | |
| 6,689,949 B2 | 2/2004 | Ortabasi | |
| 2003/0213514 A1 | 11/2003 | Ortabasi | |
| 2005/0046977 A1* | 3/2005 | Shifman | 359/853 |
| 2006/0112986 A1* | 6/2006 | Atwater et al. | 136/255 |

OTHER PUBLICATIONS

"First Office Action of China Counterpart Application", issued on Apr. 26, 2011, p. 1-p. 4, in which the listed reference was cited.

\* cited by examiner

*Primary Examiner* — Basia Ridley
*Assistant Examiner* — Devina Pillay
(74) *Attorney, Agent, or Firm* — Jianq Chyun IP Office

(57) ABSTRACT

A solar energy system includes a reflecting unit, a heat absorber and a first solar panel. The reflecting unit having a photovoltaic cell with a first energy band gap and a reflecting surface reflects or focuses sunlight. The reflecting unit converts the sunlight with a wavelength shorter than or equal to x nm into electric energy according to the first energy band gap, and reflects or focuses the sunlight with a wavelength longer than x nm onto the heat absorber and the first solar panel. The heat absorber converts the sunlight that has a wavelength longer than or equal to y nm and is reflected by the reflecting unit into thermal energy. The first solar panel having a photovoltaic cell with a second energy band gap converts the sunlight penetrating the heat absorber and having a wavelength shorter than or equal to z nm into electric energy.

13 Claims, 6 Drawing Sheets

US 8,097,803 B2

SOLAR ENERGY SYSTEM

CROSS-REFERENCE TO RELATED APPLICATION

This application claims the priority benefit of Taiwan application serial no. 97130878, filed on Aug. 13, 2008. The entirety of the above-mentioned patent application is hereby incorporated by reference herein and made a part of this specification.

BACKGROUND OF THE INVENTION

1. Field of the Invention

The present invention generally relates to an energy system, and more particularly, to a solar energy system.

2. Description of Related Art

Solar energy is never exhausted and pollution-free, which draws people's attention to solving problems of pollution and lack of energy supply confronted by the current petrochemical industry. A solar panel is able to directly convert sunlight energy into electric energy by means of photovoltaic (PV) cells thereof. In this regard, how to fully take advantage of the sunlight to get better photoelectric conversion efficiency has become very significant.

In general, a solar panel made of a silicon-based material usually has a photoelectric conversion efficiency of 20-30% only. Such low photoelectric conversion efficiency is mainly caused by the energy conversion limitation that the current solar panel only absorbs and converts partial sunlight energy with an energy band gap of 1.1 eV. In other words, only a part of the sunlight with a center wavelength shorter than 1100 nm can be absorbed, and the shorter the wavelength is, the poorer the corresponding photoelectric conversion efficiency is. Based on the above-described situation, most energy of the sunlight striking onto the solar panel is wasted and unable to be converted into electric energy, and the light unconverted by the solar panel produces heat on the solar panel to increase the temperature thereof only. Among various solar panels, a high concentration photovoltaic panel (HCPV panel) is most sensitive to the high temperature impact. In order to avoid a solar panel from having an overly high temperature, the solar panel usually needs to employ a cooling system, which thereby increases costs of fabricating the solar panel.

In short, a conventional solar energy system not only is unable to effectively convert the sunlight energy for improving the low total photoelectric conversion efficiency, but also increases the fabrication costs because of the requirement for the disposition of the cooling system.

SUMMARY OF THE INVENTION

Accordingly, the present invention is directed to a solar energy system with better total photoelectric conversion efficiency and lower fabrication cost.

The present invention provides a solar energy system which includes a reflecting unit, a heat absorber and a first solar panel. The reflecting unit has a photovoltaic (PV) cell with a first energy band gap and a reflecting surface. The reflecting unit is suitable to reflect or focus the sunlight and convert the sunlight with a wavelength shorter than or equal to x nm into electric energy according to the PV cell with the first energy band gap. The heat absorber is suitable to convert the sunlight that has a wavelength longer than or equal to y nm and is reflected by the reflecting unit into thermal energy, and the sunlight is able to penetrate the heat absorber. The heat absorber has a first surface, a liquid and a second surface, wherein the liquid is located between the first surface and the second surface, the first surface faces the reflecting surface, and the second surface backs away from the reflecting surface and faces the first solar panel. The first solar panel has a PV cell with a second energy band gap and is suitable to convert the sunlight that has a wavelength shorter than or equal to z nm and penetrates the heat absorber into the PV cell with the second energy band gap. The energy band gap of the PV cell with the first energy band gap herein is greater than the energy band gap of the PV cell with the second energy band gap, and y≧z and z>x.

In an embodiment of the present invention, the solar energy system further includes a heat-absorbing body disposed on the first surface of the heat absorber, wherein the heat-absorbing body is able to absorb the sunlight with the wavelength longer than or equal to y nm and convert the absorbed sunlight into thermal energy.

In an embodiment of the present invention, the solar energy system further includes a second solar panel disposed on the heat-absorbing body and having a PV cell with a third energy band gap, wherein the second solar panel is suitable to convert the sunlight passing through the PV cell with the third energy band gap into electric energy according to the PV cell with the third energy band gap.

In an embodiment of the present invention, the solar energy system further includes a control device for controlling the reflecting unit to face to the sun according to the position and the time of the reflecting unit.

In an embodiment of the present invention, the solar energy system further includes a thermoelectric device to convert the thermal energy produced by the heat absorber into electric energy.

In an embodiment of the present invention, the solar energy system uses the reflecting unit and the heat absorber to respectively convert a part of the sunlight with a certain wavelength into electric energy and thermal energy, wherein a waveband of the converted sunlight is not the waveband of the sunlight which is converted by the first solar panel and consists of the primary conversion portion of the solar energy system. In this way, the present invention is able to increase the total photoelectric conversion efficiency without affecting the photoelectric conversion efficiency of the original solar energy system. Additionally, in the present solar energy system, since the reflecting unit and the heat absorber have absorbed most of the energy of the sunlight, there is no need to employ a cooling system to cool down the first solar panel, which saves the fabrication costs of the solar energy system.

BRIEF DESCRIPTION OF THE DRAWINGS

The accompanying drawings are included to provide a further understanding of the invention, and are incorporated in and constituted a part of this specification. The drawings illustrate embodiments of the invention and, together with the description, serve to explain the principles of the invention.

DESCRIPTION OF THE EMBODIMENTS

Figure 1A:
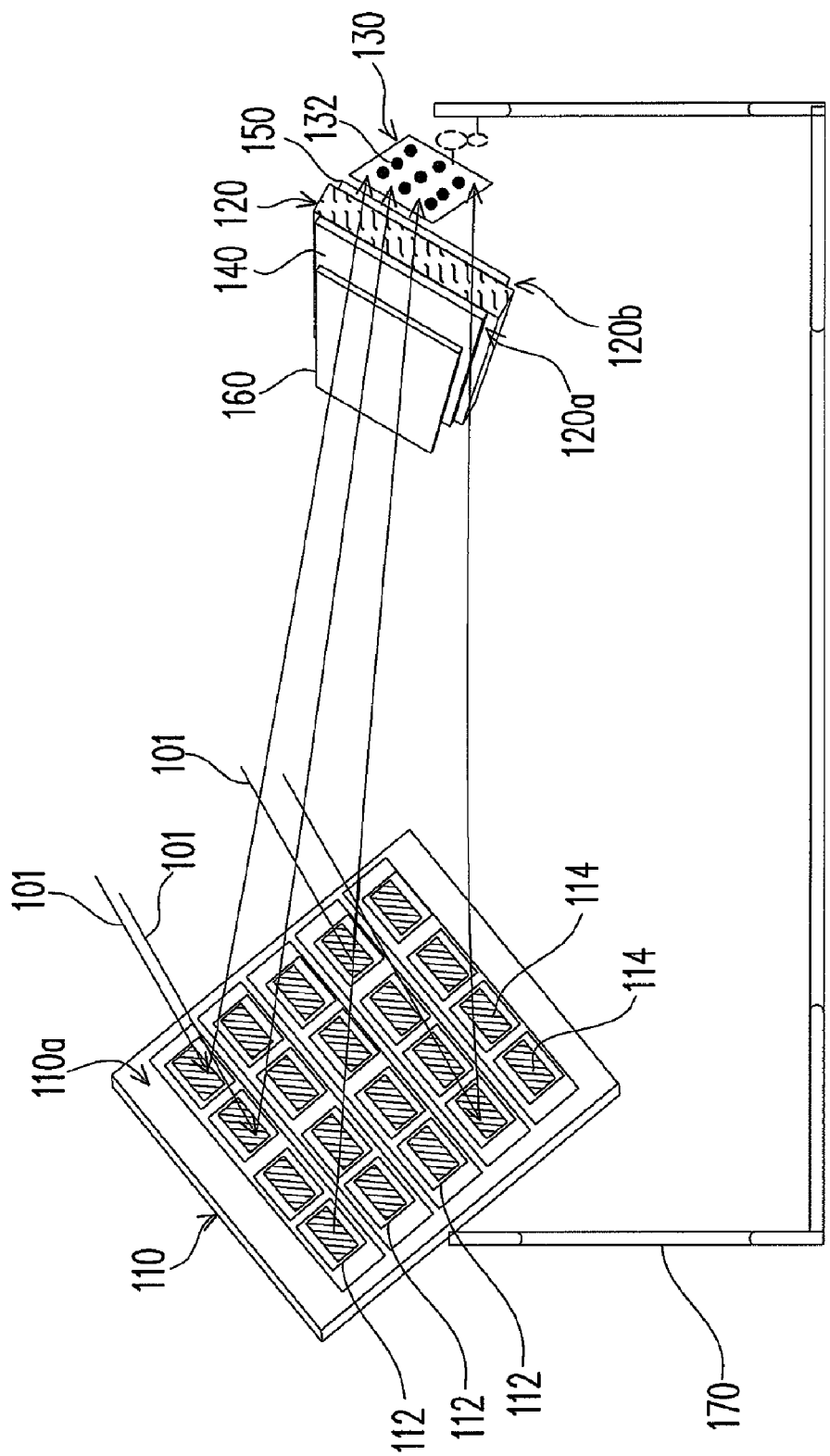
FIG. 1A is a schematic diagram of a solar energy system according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
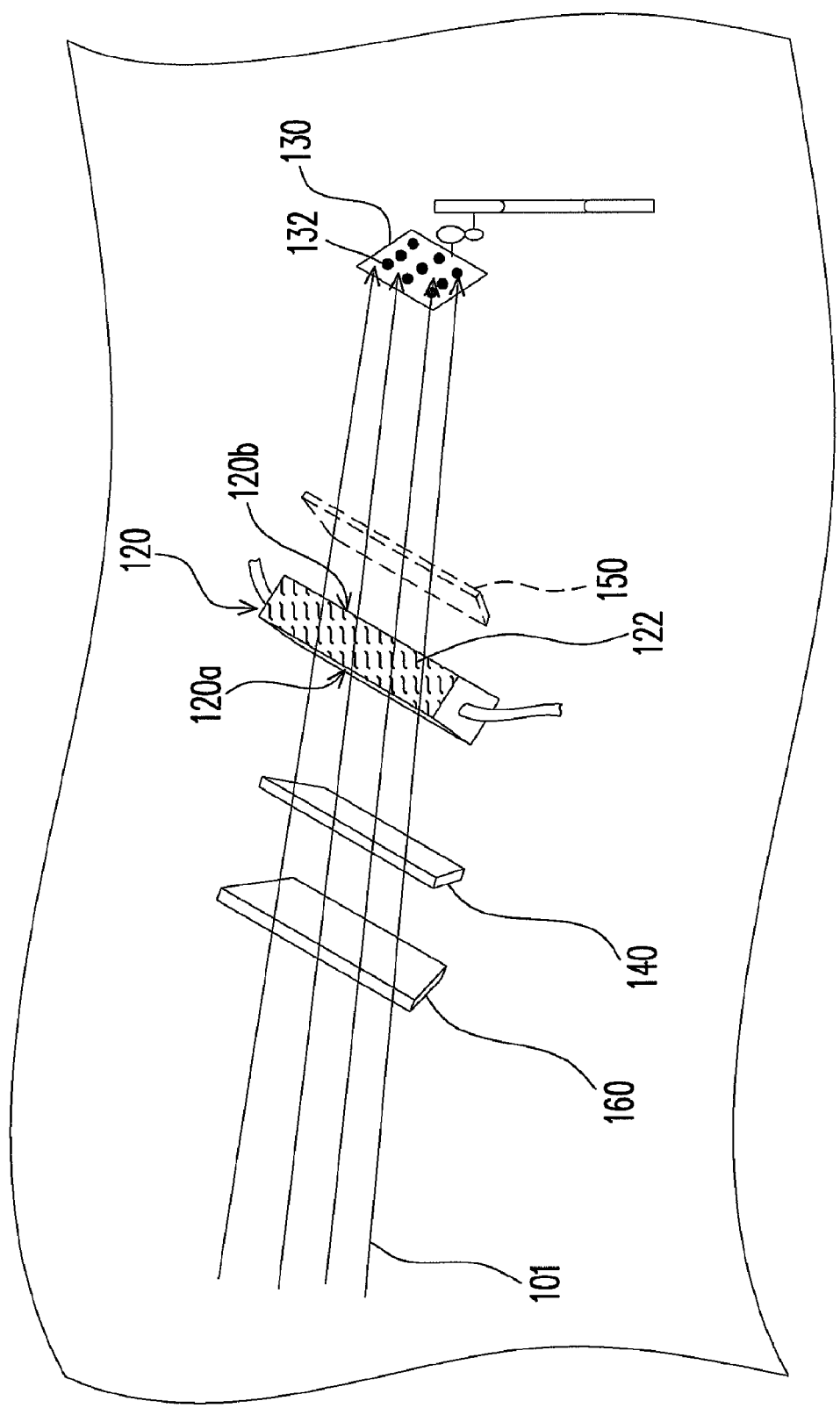
FIG. 1B is a locally enlarged diagram of the solar energy system of FIG. 1A.

FIG. 1A is a schematic diagram of a solar energy system according to an embodiment of the present invention and FIG. 1B is a locally enlarged diagram of the solar energy system of FIG. 1A. Referring to FIGS. 1A and 1B, a solar energy system 100 of the embodiment includes a reflecting unit 110, a heat absorber 120 and a first solar panel 130. The reflecting unit 110 has a PV cell 114 with a first energy band gap $Eg_1$ and a reflecting surface 110a. The reflecting unit 110 is suitable to reflect or focus the sunlight 101 and to convert the sunlight 101 with a wavelength shorter than or equal to x nm into electric energy according to the first energy band gap $Eg_1$ of the PV cell 114. The heat absorber 120 is suitable to convert the sunlight 101 that has a wavelength longer than or equal to y nm and is reflected by the reflecting unit 110 into thermal energy, wherein y>x. The sunlight 101 is able to penetrate the heat absorber 120. The heat absorber 120 has a first surface 120a, a liquid 122 and a second surface 120b. The liquid 122 is located between the first surface 120a and the second surface 120b, wherein the first surface 120a faces the reflecting surface 110a, and the second surface 120b backs away from the reflecting surface 110a. The first solar panel 130 has a PV cell 132 with a second energy band gap $Eg_2$ and is suitable to convert the sunlight 101 having a wavelength shorter than or equal to z nm and penetrating the heat absorber 120 into electric energy according to the second energy band gap $Eg_2$ of the PV cell 132, wherein the first energy band gap $Eg_1$ is greater than the second energy band gap $Eg_2$, and $y \geq z$ and z>x.

The parts of the solar energy system 100 and the working principle of the solar energy system 100 are depicted in more detail as follows.

In the embodiment, the reflecting unit 110 includes at least a reflector 112 and at least a PV cell 114, wherein the PV cells 114 are disposed on the reflectors 112, as shown in FIG. 1A. In more detail, the PV cells 114 can be formed on the reflectors 112 by using evaporation, sputtering, coating, ink-jetting or other appropriate semiconductor processes. In another embodiment, if the PV cells 114 are formed on a glass substrate (or a hard substrate), the reflectors 112 can be replaced by the PV cells 114.

In the embodiment, each PV cell 114 is, for example, an amorphous silicon PV cell (a-Si PV cell) or other appropriate PV cells with an energy band gap greater than or equal to the first energy band gap $Eg_1$. In an embodiment, the first energy band gap $Eg_1$ can be greater than or equal to 1.6 eV. Since the energy band gap of the PV cells 114 (such as the above-mentioned first energy band gap $Eg_1$) is greater than or equal to 1.6 eV, when the sunlight 101 strikes onto the reflecting unit 110, the partial sunlight 101 with a photon energy less than 1.6 eV is reflected by the reflectors 112 and is then focused on the heat absorber 120. On the other hand, the rest sunlight 101 with a photon energy greater than or equal to 1.6 eV is absorbed by the PV cells 114 and then converted into electric energy. In an embodiment, an optional reflective coating (not shown) is used to coat surfaces of upper layers of the PV cells 114 so as to reflect or focus the sunlight 101 with the wavelength longer than or equal to x nm onto the heat absorber 120.

In other words, the reflecting unit 110 converts the sunlight 101 with the wavelength shorter than or equal to x nm into electric energy based on the energy band gap of the PV cells 114, wherein the x value is determined by the first energy band gap $Eg_1$. For example, corresponding to the first energy band gap $Eg_1$ of 1.6 eV, x value is 780 nm, so that the reflecting unit 110 is able to absorb and convert the sunlight 101 with a wavelength shorter than or equal to 780 nm into electric energy through the PV cells 114. In addition, the reflecting unit 110 is further able to reflect or focus the sunlight 101 with the wavelength longer than or equal to 780 nm onto the heat absorber 120 and the first solar panel 130 through the above-mentioned optional reflective coating, which further increases the total photoelectric conversion efficiency of the solar energy system 100.

If the local weather is cloudy or the reflecting unit 110 is unable to effectively reflect or focus the sunlight 101, the PV cells 114 disposed on the reflecting unit 110 can still absorb a part of the sunlight 101 and convert the absorbed light into electric energy, so that the solar energy system 100 still keeps the better total photoelectric conversion efficiency even in cloudy weather.

In the embodiment, the reflectors 112 can be flat mirrors or parabolic mirrors for reflecting the sunlight 101, wherein the reflectors 112 are arranged in array, as shown in FIG. 1A. In more detail, when flat mirrors are used as the reflectors 112 of the reflecting unit 110, the flat mirrors can respectively have an appropriate tilt angle (not shown), so that the sunlight 101 incident onto the reflecting surfaces can be reflected onto the heat absorber 120 and the reflected sunlight 101 can be focused. The condition to focus the sunlight or the magnification of focusing the sunlight depends on the arrangement of the flat mirrors on the reflecting unit. The above-mentioned scheme is one of the implementations and the present invention is not limited thereby. Likewise, when the reflectors 112 of the reflecting unit 110 are parabolic mirrors, the above-mentioned objective can also be realized by an appropriate arrangement.

Figure 1C:
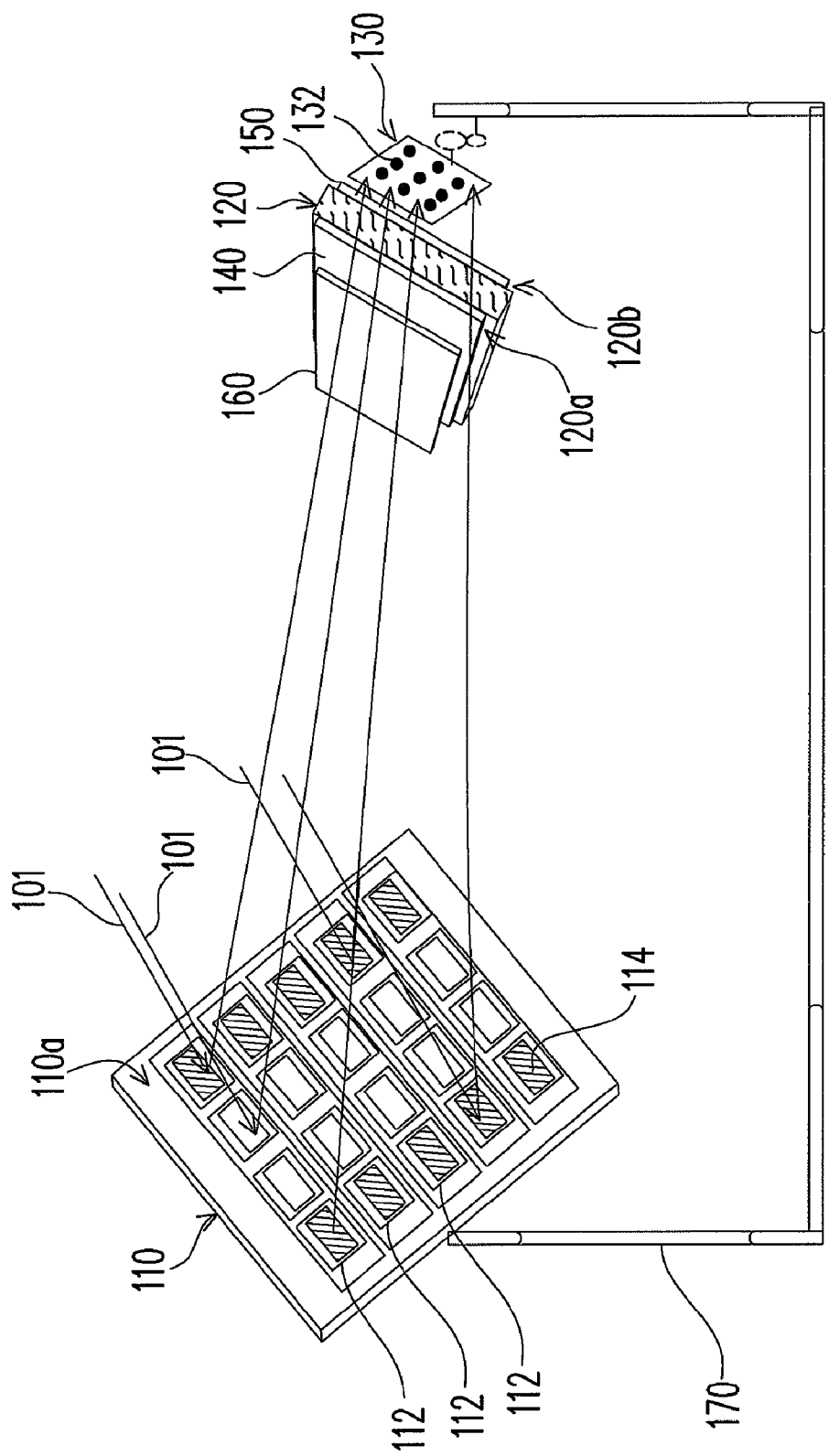
FIG. 1C is a schematic diagram of a solar energy system according to another embodiment of the present invention.

In the embodiment, the PV cells 114 occupy 100% of the total area of the reflectors 112, as shown in FIG. 1A. In another embodiment, the PV cells 114 can be partially disposed on the reflectors 112, wherein the PV cells 114 occupy 1%-100% of the total area of the reflectors 112. For example, as shown in FIG. 1C, the PV cells 114 occupy 50% of the total area of the reflectors 112. In more detail, the ratio of the total area of the PV cells 114 to the total area of the reflectors 112 is determined upon requirements of a user, such as fabrication costs or the required total photoelectric conversion efficiency. Hence, FIGS. 1A and 1C are for explanation and do not limit the scope of the present invention.

In another embodiment, the reflecting unit 110 can be a reflective thin film solar panel (not shown). In more detail, the reflective thin film solar panel not only has an energy band gap similar to the energy band gap of the above-mentioned PV cells 114 but also can further reflect the sunlight 101 with an energy band gap less than the above-mentioned energy band gap so as to function as the above-mentioned reflectors 112. In order to reflect or focus the sunlight 101 onto the heat absorber 120, a plurality of reflective thin film solar panels can also be appropriately disposed to make the sunlight 101 reflected by the reflective thin film solar panels strike onto the heat absorber 120. The above-mentioned goal can be also achieved by properly modifying the form of the reflective thin film solar panel, such as equipping the reflective thin film solar panel with a curve surface, for example. Besides, the surface of the upper layer of the reflective thin film solar panel can be coated by the above-mentioned optional reflective coating so as to reflect or focus the sunlight 101 with the wavelength longer than or equal to x nm onto the heat absorber 120.

In the embodiment, the liquid 122 disposed in the heat absorber 120 is, for example, water, wherein the water can absorb the partial sunlight 101 with wavelength ranging in the infrared waveband and penetrating the heat absorber 120 to raise the temperature of the water. In other words, the heat absorber 120 can convert the sunlight 101 having the wavelength longer than y nm and penetrating the heat absorber 120 into thermal energy, wherein y is, for example, 1100 nm. The solar energy system 100 can further include a heat-absorbing body 140 disposed on the first surface 120a of the heat absorber 120, as shown in FIGS. 1A and 1B. In the embodiment, the heat-absorbing body 140 is suitable to absorb the sunlight 101 with the wavelength longer than or equal to y nm and to convert the absorbed sunlight 101 into thermal energy, wherein y is, for example, 1100 nm. Depending on the different materials of the heat-absorbing body 140, y can be other appropriate values, and the above-mentioned y value serves as an example only.

Taking y=1100 nm as an implementation example, when the sunlight 101 penetrates the heat-absorbing body 140, the sunlight 101 with a wavelength longer than or equal to 1100 nm would be mostly absorbed by the heat-absorbing body 140 and converted into thermal energy. The heat-absorbing body 140 has good thermal contact with the first surface 120a so as to raise the temperature of the water in the heat absorber 120 higher. Note that if the water content in the heat absorber 120 is appropriate by adjustment, most energy of the sunlight 101 having the wavelength longer than or equal to 1100 nm and penetrating the water can be absorbed by the water. After the sunlight 101 penetrates the heat absorber 120, the energy of the sunlight 101 with the wavelength longer than or equal to 1100 nm is largely reduced. In this way, the solar energy system 100 has no need to employ the heat-absorbing body 140 and can still be competent to absorb most energy of the sunlight 101 with the wavelength longer than 1100 nm. Namely, whether or not the heat-absorbing body 140 disposed on the first surface 120a of the heat absorber 120 is used depends on the requirement of the user. The above-mentioned design is an example only and should not be construed as a limitation of the present invention.

In the embodiment, the solar energy system 100 further includes a reflecting body 150 disposed on the second surface 120b of the heat absorber 120, wherein the reflecting body 150 is suitable to reflect the sunlight 101 with the wavelength longer than or equal to y nm. The condition of y=1100 nm is taken as an example in the present embodiment but should not be construed as limited to the present invention. In order to entirely convert the sunlight 101 that has the wavelength longer than or equal to 1100 nm and passes through the heat absorber 120 into thermal energy or to ensure that the sunlight 101 striking onto the first solar panel 130 has the wavelength shorter than 1100 nm, the above-mentioned reflecting body 150 can be used and disposed on the second surface 120b of the heat absorber 120. In this way, the sunlight 101 with the wavelength longer than or equal to 1100 nm can be reflected, which blocks the sunlight 101 with the wavelength longer than or equal to 1100 nm from penetrating the heat absorber 120 and striking onto the first solar panel 130.

In the embodiment, based on the second energy band gap $Eg_2$, the first solar panel 130 converts the sunlight 101 having a wavelength shorter than or equal to z nm and penetrating the heat absorber 120 into electric energy. In an embodiment of the present invention, the second energy band gap $Eg_2$ is greater than or equal to 1.1 eV. For example, when the second energy band gap $Eg_2$ is equal to 1.1 eV, the first solar panel 130 is suitable to absorb the sunlight 101 with photon energy greater than or equal to the second energy band gap $Eg_2$ and to convert the absorbed light into electric energy. That is to say, the sunlight 101 with the wavelength shorter than or equal to 1100 nm is absorbed and converted, wherein the z value is equal to 1100 nm. Depending on the different values of the second energy band gap $Eg_2$, the waveband of the sunlight 101 that can be absorbed and converted by the first solar panel 130 is different. Note that the above-mentioned 1100 nm serves as an example only, and the present invention is not limited thereby. The first solar panel 130 can be a silicon-based solar panel, a monocrystal-silicon solar panel, a polysilicon solar panel or other solar panels conformable to the above-mentioned requirement.

In the embodiment, the solar energy system 100 further includes a second solar panel 160. As shown in FIGS. 1A and 1B, the second solar panel 160 is disposed on the heat-absorbing body 140 and has a PV cell with a third energy band gap $Eg_3$ (not shown). The third energy band gap $Eg_3$ herein is greater than the first energy band gap $Eg_1$, and in an embodiment, the third energy band gap $Eg_3$ is, for example, greater than or equal to 1.7 eV. The second solar panel 160 is suitable to convert the sunlight 101 passing through the second solar panel 160 into electric energy based on the third energy band gap $Eg_3$. In more detail, the second solar panel 160 is, for example, a dye-sensitized solar cell panel (a DSSC panel), a polymer organic ink solar panel, or other solar panels with higher operation temperature and the third energy band gap $Eg_3$. The above-mentioned design is an example only and does not serve as a limitation of the present invention.

In the embodiment, when the reflecting unit 110 reflects the sunlight 101 onto the second solar panel 160, the second solar panel 160 is suitable to convert the sunlight 101 into electric energy based on the third energy band gap $Eg_3$, wherein the third energy band gap $Eg_3$ is, for example, 1.7 eV. That is to say, the second solar panel 160 is suitable to absorb the sunlight 101 with photon energy greater than or equal to 1.7 eV, and in terms of the light wavelength corresponding to the above-mentioned photon energy, the second solar panel 160 can absorb the sunlight 101 with the wavelength shorter than 730 nm and convert the absorbed light into electric energy, such that the total photoelectric conversion efficiency of the solar energy system 100 is promoted.

Figure 2A:
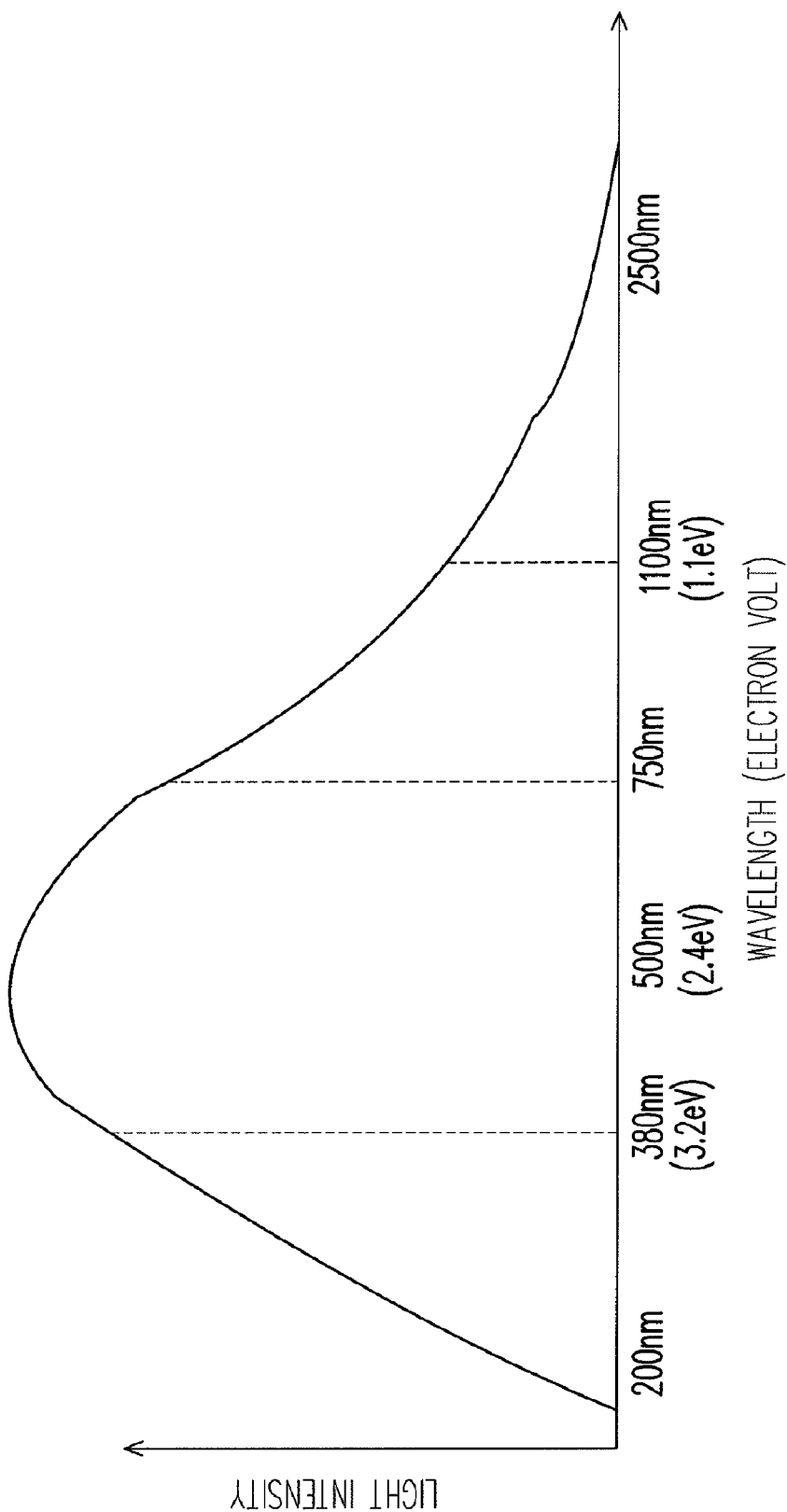
FIG. 2A is a spectrogram of the sunlight.
Figure 2C:
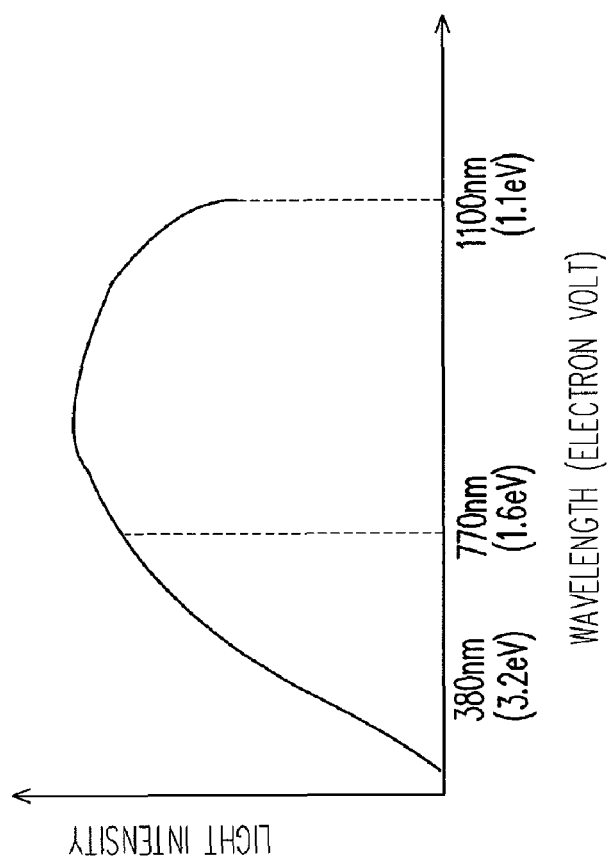
FIG. 2C is a spectrogram of the sunlight penetrating a heat absorber according to another embodiment of the present invention.
Figure 2B:
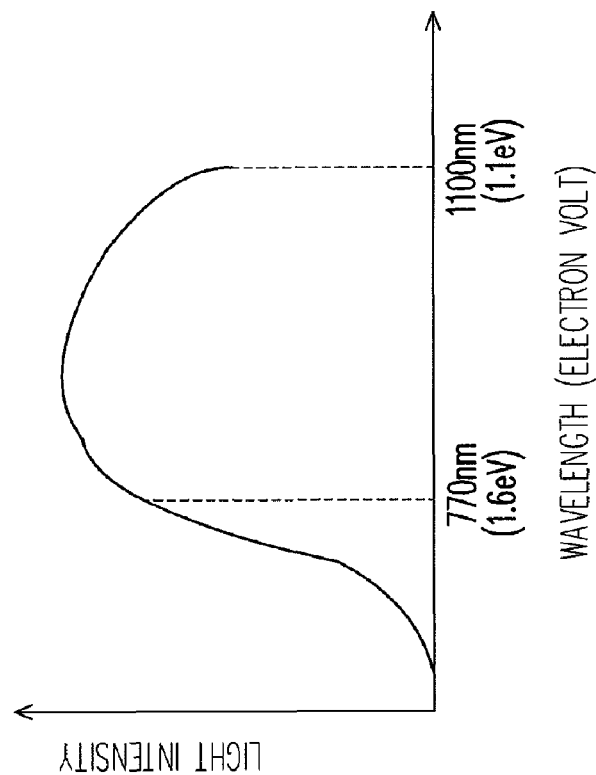
FIG. 2B is a spectrogram of the sunlight penetrating a heat absorber according to an embodiment of the present invention.

Please refer to FIGS. 2A through 2C to explain the mechanism and the performance of the solar energy system in detail. FIG. 2A is a spectrogram of the sunlight, wherein the ordinate represents light intensity and the abscissa represents light wavelength and the corresponding photon energy. FIG. 2B is a spectrogram of the sunlight penetrating a heat absorber according to an embodiment of the present invention. FIG. 2C is a spectrogram of the sunlight penetrating a heat absorber according to another embodiment of the present invention. Referring to FIG. 2A, the sunlight 101 with the light wavelengths ranging from 380 nm to 750 nm is usually considered as the visible light and the sunlight in the waveband from 380 nm to 750 nm has a larger light intensity, as shown in FIG. 2A. However, for a normal silicon-based solar panel, the wavelength range resulting in the better photoelectric conversion efficiency is between 750 nm and 1100 nm. In other words, the sunlight 101 that is beyond the above-mentioned wavelength range and strikes onto the silicon-based solar panel is unable to be effectively utilized. In addition, if the focused sunlight striking onto the solar panel may increase the photoelectric conversion efficiency of the solar panel, while the temperature of the solar panel is increased. Thereby, an additional cooling system is needed to lower down the temperature of the solar panel and the fabrication costs are accordingly increased.

Accordingly, the solar energy system 100 employs the reflecting unit 110, the heat absorber 120 and the second solar panel 160 to absorb the sunlight with a waveband featuring lower conversion efficiency for the first solar panel 130 and to convert the absorbed sunlight into electric energy. In this way, in addition to solve the above-mentioned problem of the increased temperature, the total photoelectric conversion efficiency of the solar energy system 100 can also be promoted.

In more detail, referring to FIGS. 1A and 2B, the sunlight 101 as shown in the spectrogram of FIG. 2B is reflected by the reflecting unit 110 and then penetrates the second solar panel 160 and the heat absorber 120. The reflecting unit 110 can absorb the light with the wavelength corresponding to the first energy band gap $Eg_1$ and convert the absorbed light into electric energy. The second solar panel 160 can absorb the light with the wavelength corresponding to the third energy band gap $Eg_3$. The heat absorber 120 can absorb the sunlight 101 with the wavelength longer than or equal to y nm and convert the absorbed light into thermal energy. In the embodiment, the first energy band gap $Eg_1$ is, for example, 1.6 eV. The third energy band gap $Eg_3$ is, for example, 1.7 eV. The y value is, for example, 1100 nm. With the above-mentioned design, the spectrum intensity of the sunlight 101 penetrating the heat absorber 120 mostly ranges from 770 nm to 1100 nm, as shown in FIG. 2B. In short, the above-mentioned configuration makes the sunlight striking onto the first solar panel 130 have the spectrogram as shown in FIG. 2B, and the first solar panel 130 then has the better photoelectric conversion efficiency and a better operation temperature without employing a cooling system, which saves the fabrication costs of the solar energy system 100.

Note that the solar energy system 100 employs the reflecting unit 110, the heat absorber 120 and the second solar panel 160, which not only has the above-mentioned advantages, but also increases the performance of the total photoelectric conversion efficiency. In this regard, for example, the reflecting unit 110 and the second solar panel 160 directly convert the partial sunlight with the other waveband into electric energy, and the heat absorber 120 absorbs the sunlight with the waveband longer than or equal to 1100 nm and converts the absorbed sunlight into thermal energy. In particular, if a heat engine and an alternator are employed, the thermal energy can be further converted into electric energy, which further promotes the total photoelectric conversion efficiency of the solar energy system 100.

In another embodiment, the solar energy system 100 does not employ the second solar panel 160, and after the sunlight 101 penetrates the heat absorber 120, the spectrogram of the sunlight 101 is as shown in FIG. 2C. In more detail, the spectrogram of FIG. 2C indicates that the sunlight 101 is reflected by the reflecting unit 110 and then penetrates the heat absorber 120. The reflecting unit 110 herein is suitable to absorb the light with a wavelength corresponding to the first energy band gap $Eg_1$ and to convert the absorbed light into electric energy, and the heat absorber 120 is suitable to absorb the sunlight 101 with the wavelength longer than or equal to y nm and to convert the absorbed light into thermal energy. In the embodiment, the first energy band gap $Eg_1$ is, for example, 1.6 eV and the y value is, for example, 1100 nm; therefore, the spectrum intensity of the sunlight 101 penetrating the heat absorber 120 mostly ranges from 380 nm to 1100 nm, as shown in FIG. 2C. The sunlight which strikes onto the first solar panel 130 has the spectrogram shown in FIG. 2C. It can be seen by comparing FIG. 2A with FIG. 2C that although a part of visible light strikes onto the first solar panel 130, the light intensity of the part of visible light has been largely absorbed and utilized by the reflecting unit 110 and the heat absorber 120. In other words, the above-mentioned configuration is able to make the first solar panel 130 have the better photoelectric conversion efficiency and the better operation temperature without employing a cooling system, which saves the fabrication costs of the solar energy system 100.

Note that whether or not the second solar panel 160 is disposed in the solar energy system 100 depends on the requirements of the user. For example, the total photoelectric conversion efficiency, the heat-absorbing efficiency, and the fabrication costs are the factors to be considered.

In the embodiment, the solar energy system can further have a control device 170, as shown in FIG. 1A. The control device 170 controls the reflecting unit 110 to face the sun according to the position of the reflecting unit 110 and the time. In more detail, along with different positions and time of the reflecting unit 110, the height and the direction of the sun in relation to the reflecting unit 110 are different; therefore, the control device 170 needs to adjust the reflecting unit 110 to face the sun according to the present time and the real position, so that the reflecting unit 110 can effectively reflect or focus the sunlight 101 onto the heat absorber 120 and the first solar panel 130, as shown in FIG. 1A.

Figure 3:
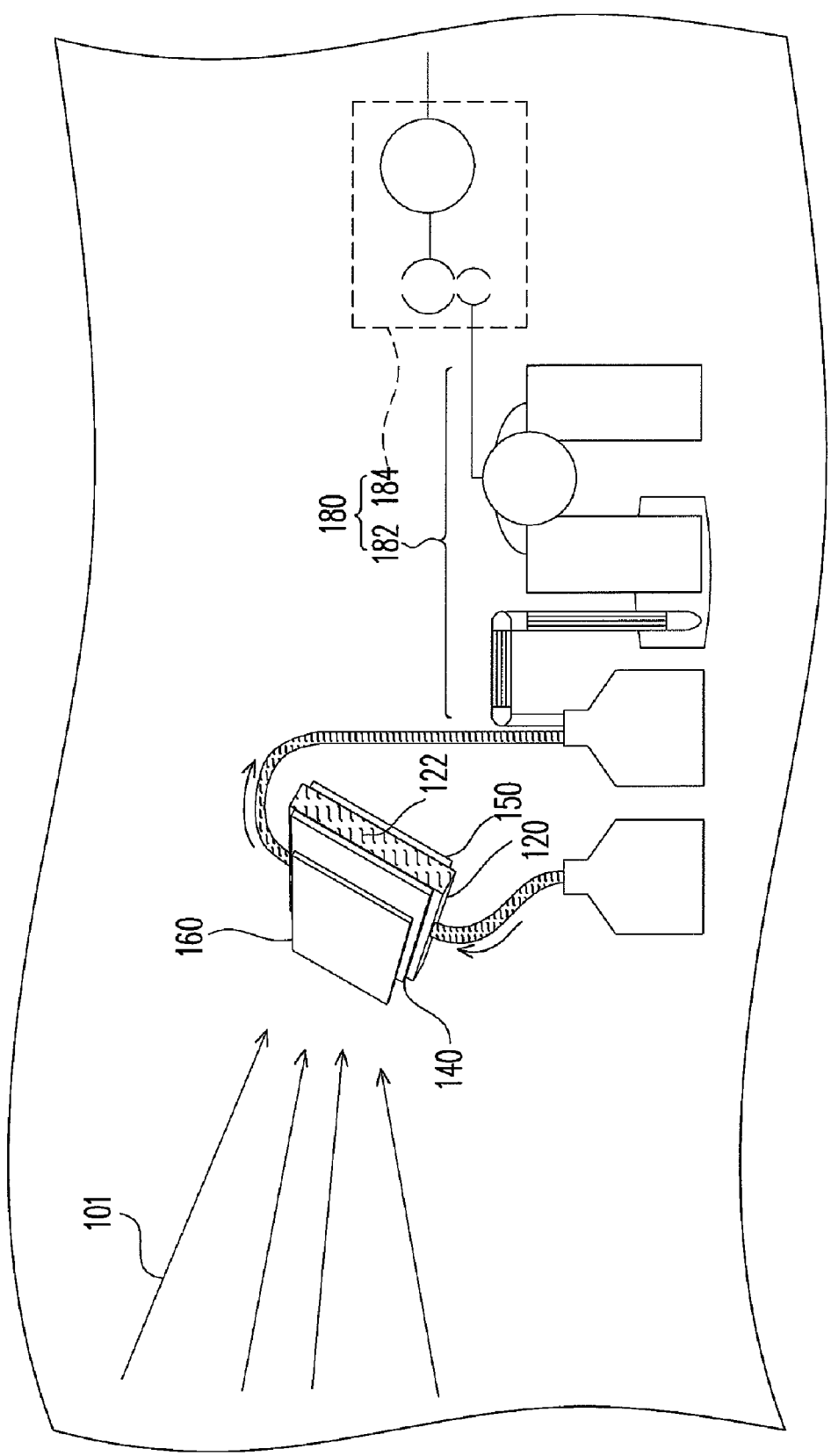
FIG. 3 is a locally enlarged diagram of the solar energy system according to another embodiment of the present invention.

FIG. 3 is a locally enlarged diagram of the solar energy system according to another embodiment of the present invention. Referring to FIG. 3, the above-mentioned solar energy system 100 further includes a thermoelectric device 180, wherein the thermoelectric device 180 is connected to the heat absorber 120, as shown in FIG. 3. The thermoelectric device 180 is suitable for converting the thermal energy produced by the heat absorber 120 into electric energy. In the embodiment, the thermoelectric device 180 comprises a heat engine 182 and an alternator 184, for example, and the heat engine 182 is mechanically connected to the alternator 184, as shown by FIG. 3. In more detail, the heat engine 182 is suitable to absorb the thermal energy resulting from an increasing temperature of the liquid 122 in the heat absorber 120 and to generate mechanical moving energy based on the thermo-electrical effect. The heat engine 182 then drives the alternator 184 to complete an energy conversion from thermal energy into electric energy, which furthermore promotes the total photoelectric conversion efficiency of the solar energy system 100. The above-mentioned configuration is an example only. In fact, the thermoelectric device 180 can be replaced by other devices capable of converting thermal energy into electric energy.

In summary, the solar energy system of the present invention uses the reflecting unit and the heat absorber to respectively convert a part of the sunlight with a certain waveband into electric energy and thermal energy. The light wavebands to be converted by the reflecting unit and the heat absorber are not the waveband for the first solar panel to convert the sunlight into the primary electric energy; therefore, the total photoelectric conversion efficiency of the solar energy system is increased. In addition, since the reflecting unit and the heat absorber have converted or absorbed the energy of the sunlight with a part of the waveband, the solar energy system does not need to employ a cooling system to cool the first solar panel, which saves the fabrication costs of the solar energy system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solar energy system, comprising:
a reflecting unit, having a photovoltaic cell with a first energy band gap and a reflecting surface for reflecting or focusing sunlight, wherein the photovoltaic cell with the first energy band gap is used to convert the sunlight with a wavelength shorter than or equal to x nm into electric energy;
a heat absorber, suitable to convert the sunlight reflected by the reflecting unit and having a wavelength longer than or equal to y nm into thermal energy, wherein the heat absorber has a first surface, a liquid and a second surface, the liquid is located between the first surface and the second surface, the first surface faces the reflecting surface, and the second surface faces away from the reflecting surface; and
a first solar panel, having a photovoltaic cell with a second energy band gap, wherein the photovoltaic cell with the second energy band gap is used to convert the sunlight penetrating the heat absorber and having a wavelength shorter than or equal to z nm into electric energy, wherein the first energy band gap is greater than the second energy band gap, and $y \geq z$ and $z > x$.

2. The solar energy system according to claim 1, further comprising a reflector disposed on the reflecting surface, wherein the photovoltaic cell with the first energy band gap is disposed on the reflector, and the reflector is a flat mirror or a parabolic mirror.

3. The solar energy system according to claim 1, wherein the reflecting unit is a reflective thin film solar panel.

4. The solar energy system according to claim 3, wherein a surface of an upper layer of the reflective thin film solar panel comprises an optional reflective coating to reflect or focus the sunlight with the wavelength longer than or equal to x nm onto the heat absorber.

5. The solar energy system according to claim 1, further comprising a heat-absorbing body disposed on the first surface of the heat absorber, wherein the heat-absorbing body absorbs the sunlight with the wavelength longer than or equal to y nm and converts the absorbed sunlight into thermal energy.

6. The solar energy system according to claim 1, further comprising a reflecting body disposed on the second surface of the heat absorber, wherein the reflecting body is suitable for reflecting the sunlight with the wavelength longer than or equal to y nm.

7. The solar energy system according to claim 1, wherein the first energy band gap is greater than or equal to 1.6 eV.

8. The solar energy system according to claim 1, wherein the second energy band gap is greater than or equal to 1.1 eV.

9. The solar energy system according to claim 1, further comprising a second solar panel disposed on the heat-absorbing body and having a photovoltaic cell with a third energy band gap, wherein the second solar panel uses the photovoltaic cell with the third energy band gap to convert the sunlight passing through the photovoltaic cell with the third energy band gap into electric energy.

10. The solar energy system according to claim 9, wherein the third energy band gap is greater than or equal to 1.7 Ev, and the third energy band gap is greater than the first energy band gap.

11. The solar energy system according to claim 1, wherein the liquid is water.

12. The solar energy system according to claim 1, further comprising a control device for controlling the reflecting unit to face the sun according to the position of the sun, so that the reflecting unit reflects or focuses the sunlight onto the heat absorber and the first solar panel.

13. The solar energy system according to claim 1, further comprising a thermoelectric device to convert the thermal energy produced by the heat absorber into electric energy.

* * * * *